United States Patent
Yu et al.

(10) Patent No.: US 11,109,507 B2
(45) Date of Patent: Aug. 31, 2021

(54) COOLING SYSTEM AND COOLING METHOD

(71) Applicant: ABB Power Grids Switzerland AG, Baden (CH)

(72) Inventors: Rongrong Yu, Beijing (CN); Robert Saers, Vasteras (SE); Tor Laneryd, Enkoping (SE)

(73) Assignee: ABB Power Gnids Switzerland AG, Baden (CH)

( * ) Notice: Subject to any disclaimer, the term of this patent is extended or adjusted under 35 U.S.C. 154(b) by 0 days.

(21) Appl. No.: 16/536,969

(22) Filed: Aug. 9, 2019

(65) Prior Publication Data

US 2019/0364692 A1 Nov. 28, 2019

Related U.S. Application Data

(63) Continuation of application No. PCT/CN2017/081042, filed on Apr. 19, 2017.

(51) Int. Cl.
*H01F 27/08* (2006.01)
*H05K 7/20* (2006.01)

(52) U.S. Cl.
CPC ....... *H05K 7/20145* (2013.01); *H01F 27/085* (2013.01); *H05K 7/20127* (2013.01)

(58) Field of Classification Search
None
See application file for complete search history.

(56) References Cited

U.S. PATENT DOCUMENTS

2001/0032718 A1 10/2001 Sheerin et al.
2009/0315657 A1 12/2009 Hoffman et al.
(Continued)

FOREIGN PATENT DOCUMENTS

CN 1497821 A 5/2004
CN 204718169 U 10/2015
(Continued)

OTHER PUBLICATIONS

English translation of Takami Japanese Patent Publication No. JPS6155904 (1986).*
(Continued)

*Primary Examiner* — Bernard G Lindsay
(74) *Attorney, Agent, or Firm* — Sage Patent Group

(57) ABSTRACT

A cooling system for a high voltage electromagnetic induction device, includes: at least one duct filled with a first coolant and surrounded by a second coolant, each being routed along a direction of natural convection; at least one group of fans, each fan of the group being mounted along a respective duct of the at least one duct along the direction of natural convection and being configured to blow for the-second-coolant-forced cooling; at least one group of electric motors, each electric motor being configured to operate a respective fan of the at least one group of fans; at least one group of switches, each switch being configured to control a respective electric motor of the at least one group of electric motors. A method of cooling a high voltage electromagnetic induction device is also provided. By using the option of operating fans with higher cooling rate, because of the less fans are operating, the predetermined cooling capacity can be reached with lower power consumption.

16 Claims, 3 Drawing Sheets

(56) References Cited

U.S. PATENT DOCUMENTS

| | | | | |
|---|---|---|---|---|
| 2011/0144825 A1* | 6/2011 | Yamasaki | ............... | G06F 1/20 |
| | | | | 700/300 |
| 2014/0374068 A1* | 12/2014 | Zeng | ............... | H05K 7/20236 |
| | | | | 165/104.33 |
| 2015/0361864 A1* | 12/2015 | Wagner | ................. | F01P 7/08 |
| | | | | 165/300 |
| 2019/0027292 A1* | 1/2019 | Findeisen | ............. | H01F 27/08 |

FOREIGN PATENT DOCUMENTS

| | | | |
|---|---|---|---|
| CN | 105135730 | A | 12/2015 |
| EP | 2713688 | A2 | 4/2014 |
| EP | 2978292 | A1 | 1/2016 |
| EP | 3032552 | A1 | 6/2016 |
| JP | 61055904 | A | 3/1986 |
| JP | H11104817 | A | 4/1999 |
| JP | 2014220182 | A | 11/2014 |
| WO | 2015058354 | A1 | 4/2015 |

OTHER PUBLICATIONS

State Intellectual Property Office of the P.R. China, International Search Report & Written Opinion issued in corresponding Application PCT/CN2017/081042, dated Oct. 27, 2017, 9 pp.
Indian Examination Report for Indian application No. 201947031758 dated Jun. 30, 2020, 5 pages.
Canadian Examination Report for Canadian Application No. 3,053,258 dated Oct. 6, 2020, 4 pages.
European Search Report for European Application No. 17906696.4 dated Oct. 28, 2020, 8 pages.

\* cited by examiner

COOLING SYSTEM AND COOLING METHOD

TECHNICAL FIELD

The invention relates to control of temperature of a power equipment, and more particularly to control of temperature of a high voltage electromagnetic induction device, with digital data processing.

BACKGROUND ART

High voltage electromagnetic induction devices, such as power transformers, comprise windings, typically electrically insulated conductors, wound around a magnetic core. The windings of a high voltage electromagnetic induction devices are often subjected to currents that result in heat development in the windings that would damage the electrical insulation of the conductors, and even the conductors, if cooling of the windings would not be provided.

There are a number of ways in which a high voltage electromagnetic induction device may be cooled. Cooling may for example be performed by means of natural or forced convection of a liquid such as oil circulating through the tank of high voltage electromagnetic induction device. For higher voltages, it is common to utilize a dedicated cooling system comprising a number of motor-fan units to maintain the winding temperature within an acceptable range.

One example is described in Patent EP 3 032 552 A, which discloses a cooling system for high voltage electromagnetic induction device e.g. power transformer, has control system arranged to individually control multiple switches to obtain individual control of multiple fans. It provides only control of cooling operations with same continuous variation of cooling capacity as with motor speed control. But, the solution according to the patent has disadvantage that a sum of the power consumption by the operating fans is not considered so it may be is relatively high, which accomplish a predetermined amount of cooling capacity.

BRIEF SUMMARY OF THE INVENTION

According to an aspect of present invention, it provides a cooling system for a high voltage electromagnetic induction device, including: at least one duct filled with a first coolant and surrounded by a second coolant, each being routed along a direction of natural convection; at least one group of fans, each fan of the group being mounted along a respective duct of the at least one duct along the direction of natural convection and being configured to blow for the-second-coolant-forced cooling; at least one group of electric motors, each electric motor being configured to operate a respective fan of the at least one group of fans; at least one group of switches, each switch being configured to control a respective electric motor of the at least one group of electric motors; and a control system, being configured to obtain at least one group of data sets, each data set representing parameter associated with a respective fan of the at least one group of fans, in consideration of the obtained parameters, through knowledge-based predetermined numerical and/or logical linkages, select at least one fan in the at least one group of fans to blow for the-second-coolant-forced cooling supplying predetermined amount of cooling capacity according to criteria for cooling rate optimization of the cooling system, and individually control each switch to thereby obtain individual control of each fan.

According to another aspect of present invention, it provides a method of cooling a high voltage electromagnetic induction device, wherein: the high voltage electromagnetic induction device includes: at least one duct filled with a first coolant and surrounded by a second coolant, each being routed along a direction of natural convection; at least one group of fans, each fan of the group being mounted along a respective duct of the at least one duct along the direction of natural convection and being configured to blow for the-second-coolant-forced cooling; at least one group of electric motors, each electric motor being configured to operate a respective fan of the at least one group of fans; at least one group of switches, each switch being configured to control a respective electric motor of the at least one group of electric motors. The method includes: obtaining at least one group of data sets, each data set representing parameter associated with a respective fan of the at least one group of fans; in consideration of the obtained parameters, through knowledge-based predetermined numerical and/or logical linkages, selecting at least one fan in the at least one group of fans to blow for the-second-coolant-forced cooling supplying predetermined amount of cooling capacity according to criteria for cooling rate optimization of the cooling system; and individually controlling each switch to thereby obtain individual control of each fan.

Cooling rate is a terminology indicating a sum of the power consumed by the operating fans. A higher cooling rate corresponds to lower power consumption caused by the operating fans to supply a certain amount of cooling capacity. With different combinations of operating fans, even they provide identical cooling capacity, they may behave various cooling rates, some are higher and some are lower. Therefore, in order to have the sum of the power consumption by the operating fans below a certain amount that accomplishes a predetermined cooling capacity, the control system may need to know some parameters associated with the respective fan of the at least one group of fans. By using the option of operating fans with higher cooling rate, because of the less fans are operating, the predetermined cooling capacity can be reached with lower power consumption.

Preferably, the control system is further configured to control to start the selected fan and to suspend the rest.

The cooling capacity of the operating fans is based on how it is positioned, as different positions give access to different parts of the second coolant, which, in turn, flow to ambient environment at a lower temperature allowing the dissipation of the heat. The ambient environment may have a large quantities of cold second coolant, like the air. A fan that is placed in a position negative in the direction of natural convection might not have access to the same amount of cold ambient air, as a fan placed in a position positive in the direction of natural convection. In addition, for the high voltage electromagnetic induction device filled with a dielectric liquid such as mineral oil, the cooling capacity of a fan will also depend on the direction of natural convection, generating a larger oil circulation if placed on a position relatively positive in the direction of natural convection. Therefore, preferably, at least one parameter associated with the respective fan concerns with its level along the direction of natural convection. Consequently, at least two fans of the at least one group of fans are preferably mounted at different levels along the direction of natural convection.

As for the scenario where the cooling system includes a multiple of ducts, the cooling capacity of two fans will be better if they blow air on two different groups of ducts, rather than the same group of ducts in series. Therefore, preferably, the parameter associated with the respective fan may further concern with which of the at least one ducts it is mounted along. Consequently, at least two fans of the at least one group of fans are preferably mounted along different ducts of the at least one group of ducts.

Preferably, the first coolant uses dielectric liquid; and the second coolant uses air.

BRIEF DESCRIPTION OF THE DRAWINGS

The subject matter of the invention will be explained in more detail in the following text with reference to preferred exemplary embodiments which are illustrated in the drawings, in which.

The reference symbols used in the drawings, and their meanings, are listed in summary form in the list of reference symbols. In principle, identical parts are provided with the same reference symbols in the figures.

PREFERRED EMBODIMENTS OF THE INVENTION

Figure 1:
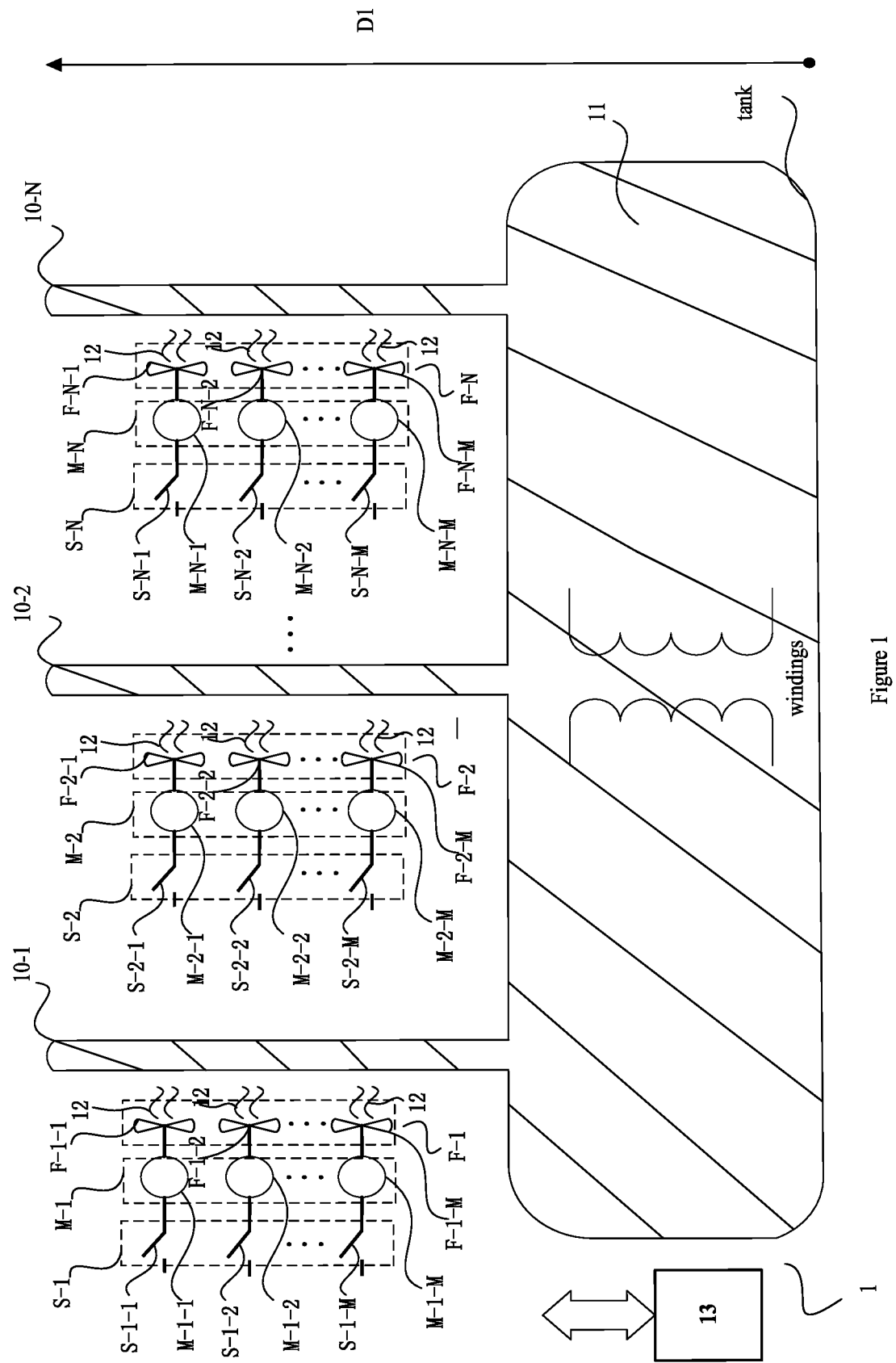
FIG. 1 shows a high voltage electromagnetic induction device according to an embodiment of present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

FIG. 1 shows a high voltage electromagnetic induction device according to an embodiment of present invention. As shown in FIG. 1, the high voltage electromagnetic induction device is filled with a first coolant 11 that both cools and insulates its windings. A cooling system 1 for the high voltage electromagnetic induction device includes at least one duct 10-1 to 10-N extending from a tank, N being an integer equal to or greater than one. The tank may enclose the windings and be filled with a first coolant 11. The duct 10-1 to 10-N may be shaped like a pipe, having a tubular section or hollow cylinder circulating the first coolant 11 within the tank and itself, and thus the duct 10-1 to 10-N is filled with the first coolant 11. The duct 10-1 to 10-N each is routed along a direction of natural convection D1, for example in a vertical direction. The duct 10-1 to 10-N may be surrounded by a second coolant 12 which may convey the heat to the environmental area having a lower temperature. The duct 10-1 to 10-N may behave as a radiator through which the first coolant 11 circulates by natural convection and radiate the heat to the second coolant 12, which, in turn, may dissipate the heat to the environment. The first coolant 11, for example may be dielectric liquid like refined mineral oil, may cool the windings and insulation by circulating within the tank and the ducts 10-1 to 10-N. The second coolant 12 may be air.

The cooling system 1 may include at least one group of fans F-1 to F-N, each fan of the group being mounted along a respective duct 10-1 to 10-N along the direction of natural convection D1 and being configured to blow for the-second-coolant-forced cooling. The numbers of the fans in each group may be equal or different. In this embodiment, they are equal to M, and for the fan group F-1, it contains fans indicated by reference signs F-1-1 to F-1-M, and similar indication holds true for the other fan groups. For each fan group, its fans may be arranged in line or otherwise, for example in a spiral around the duct extending along the direction of natural convection D1.

Cooling system 1 comprises at least one group of electric motors M-1 to M-N, each electric motor being configured to operate a respective fan of the at least one group of fans F-1 to F-N. For example, for electric motor group M-1, a plurality of electric motors M-1-1 to M-1-M are arranged to operate a respective fan F-1-1 to F-1-M of the fan group F-1. At least one group of switches S-1 to S-N, each switch being configured to control a respective electric motor of the at least one group of electric motors M-1 to M-N. For example, a plurality of switches S-1-1 to S-1-M are arranged to control a respective electric motor M-1-1 to M-1-M. Each switch is arranged to provide on/off control of a respective electric motor. Each switch may according to one variation comprise a relay that may be electromechanical or electrical, in the latter case e.g. in the form of one or more power electronic devices such as insulated-gate bipolar transistors (IGBT) and/or thyristors.

In this embodiment, the cooling system comprises exactly M*N fans, M*N motors and M*N switches, N being an integer equal to or greater than one, and M being an integer equal to or greater than one.

Each motor is arranged to operate a respective fan of the M*N fans, and each switch is arranged to control a respective motor of the M*N motors. There is hence a one-to-one correspondence between the fans, motors, and switches.

The cooling system 1 comprises a control system 13 arranged to control each switch of the switch groups S-1 to S-N individually. The control system 13 is thus arranged to control opening and closing of each switch. Individual control of each fan of the fan groups F-1 to F-N may thereby be provided.

Cooling rate is a terminology indicating a sum of the power consumed by the operating fans. A higher cooling rate corresponds to lower power consumption caused by the operating fans to supply a certain amount of cooling capacity. The operating fans may be selected from various fan groups F-1 to F-N. With different combinations of operating fans, even they provide identical cooling capacity, they may behave various cooling rates, some are higher and some are lower. Therefore, in order to have the sum of the power consumption by the operating fans below a certain amount that accomplishes a predetermined cooling capacity, the control system 1 may need to know some parameters associated with the respective fan of the at least one group of fans F-1 to F-N. The control system 1 may obtain at least one group of data sets D-1 to D-N, each data set representing parameter associated with a respective fan of the at least one group of fans. For example, for fan group F-1, a plurality of data sets D-1-1 to D-1-M of the data set group D-1 are associated with a respective fan F-1-1 to F-1-M of the fan group F-1, and this reference sign principle applies to the other data set group and the other fan group. By selecting the fans as operating fans in the fan groups F-1 to F-N, their parameters are set.

The cooling capacity of the operating fans is based on how it is positioned, as different positions give access to different parts of the second coolant, which, in turn, flow to ambient environment at a lower temperature allowing the dissipation of the heat. The ambient environment may have a large quantities of cold second coolant, like the air. A fan that is placed in a position negative in the direction of natural convection might not have access to the same amount of cold ambient air, as a fan placed in a position positive in the direction of natural convection. In addition, for the high voltage electromagnetic induction device filled with a dielectric liquid such as mineral oil, the cooling capacity of a fan will also depend on the direction of natural convection, generating a larger oil circulation if placed on a position relatively positive in the direction of natural convection. For example, for the same fan group F-1, to provide the same cooling capacity, the cooling rate of fan F-1-1 is higher than that of fan F-1-M; for different fan groups F-1, F-2, to provide the same cooling capacity, the cooling rate of fan F-2-1 is higher than that of fan F-1-3. Therefore, at least one parameter associated with the respective fan concerns with its level along the direction of natural convection.

Besides, as for the scenario where the cooling system 1 includes a multiple of ducts, the cooling capacity of two fans will be better if they blow air on two different groups of ducts, rather than the same group of ducts in series. For example, for the same cooling capacity, the cooling rate of a combination of operating fans F-1-2, F-2-3 is higher than that of fans F-1-2, F-1-3. Therefore, preferably, the parameter associated with the respective fan may further concern with which of the at least one ducts it is mounted along.

Figure 2B:
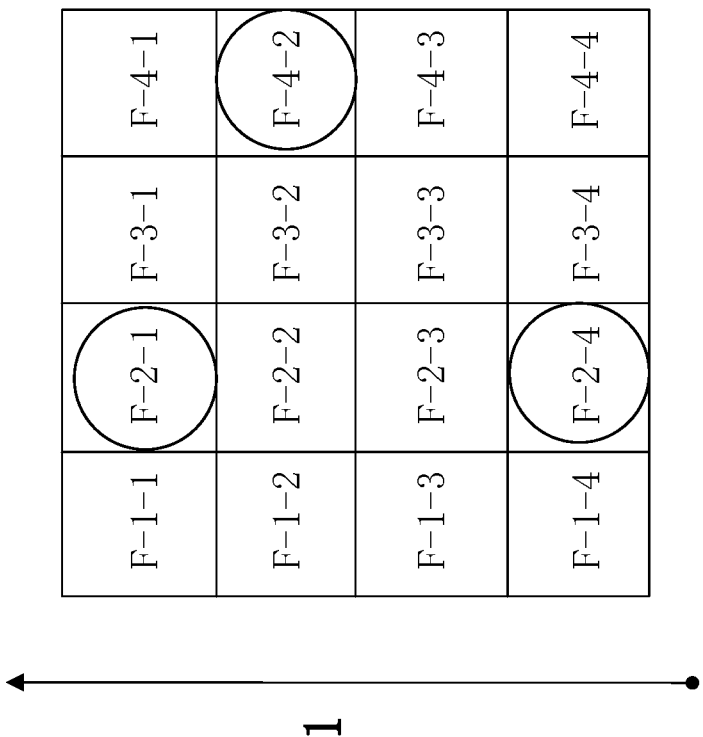
FIGS. 2A and 2B show the cooling system according to the embodiment of present invention.
Figure 2A:
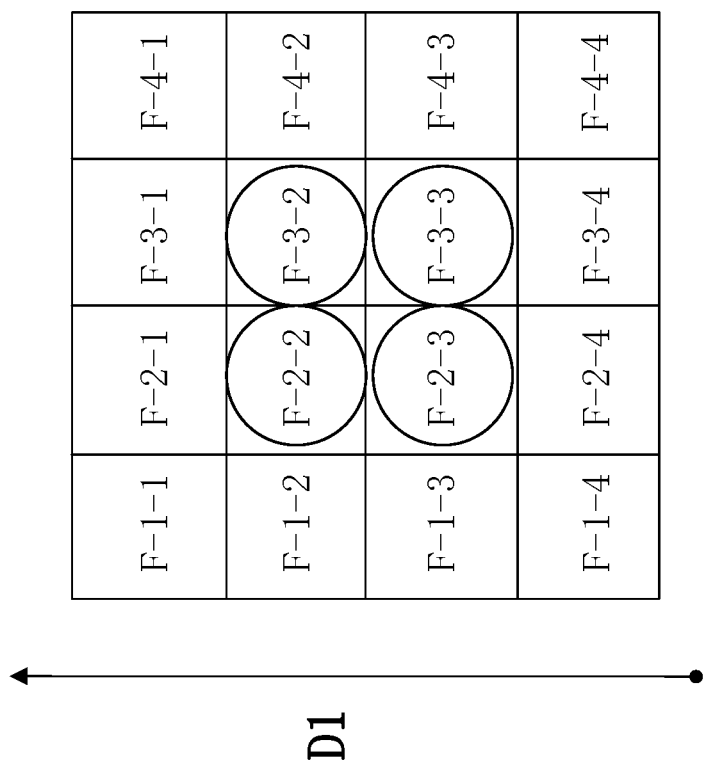

FIGS. 2A and 2B show the cooling system according to the embodiment of present invention. In this embodiment, for example, N equals to 4 and M equals to 4. In consideration of the obtained parameters, through knowledge-based predetermined numerical and/or logical linkages, the control system 13 may select at least one fan in the at least one group of fans F-1 to F-4 to blow for the-second-coolant-forced cooling supplying predetermined amount of cooling capacity according to criteria for cooling rate optimization of the cooling system 1. In this embodiment for example, there are 16 fans in all for the high voltage electromagnetic induction device, assuming the operating fans consume equal amount of power.

As shown in FIG. 2A, fans F-2-2, F-2-3, F-3-2, F-3-3 indicated by circles may be an option to blow for the-second-coolant-forced cooling supplying predetermined amount of cooling capacity according to the criteria for cooling rate optimization of the cooling system 1. In comparison, as shown in FIG. 2B, fans F-2-1, F-2-4, F-4-2 indicated by circles may be another option to blow for the-second-coolant-forced cooling supplying predetermined amount of cooling capacity according to the criteria for cooling rate optimization of the cooling system 1. If the fans are selected according to either of the two options, they can achieve identical cooling capacity, for example 25% of cooling capacity for operating all of the 16 fans. In the case of FIG. 2A, the cooling rate is calculated at 6.25% as a result of 25% (cooling capacity) divided by 4 (the number of operating fans). While, In the case of FIG. 2B, the cooling rate is calculated at 8.33% as a result of 25% (cooling capacity) divided by 3 (the number of operating fans). Even though the case of FIG. 2B only needs 3 fans to be operating, it can still reach the same cooling capacity to the case of FIG. 2A by properly allocating the position of operating fans. By using the option with higher cooling rate, because of the less fans are operating, the predetermined cooling capacity can be reached with lower power consumption. Based on the outcome of the calculation through the above knowledge-based predetermined numerical and/or logical linkages, the control system 13 may decide for the option according to FIG. 2B, consequently it may individually control each switch to thereby obtain individual control of each fan. In this embodiment, the control system 13 may control to start the selected fans F-2-1, F-2-3, F-4-2 and to suspend the rest.

In this embodiment, at least two fans F-2-1, F-2-4 of the at least one group of fans F-1 to F-4 are mounted at different levels along the direction of natural convection. At least two fans F-2-1, F-4-2 of the at least one group of fans F-1 to F-4 are mounted along different ducts of the at least one group of ducts 10-2, 10-4.

The cooling capacity can either be calculated, or measured. A method for calculating the cooling capacity is to set up two parallel networks for temperature and pressure which describes the first coolant flow in the ducts 10-1 to 10-4, as shown for the example with 16 fans in FIGS. 2A and 2B.

Figure 3:
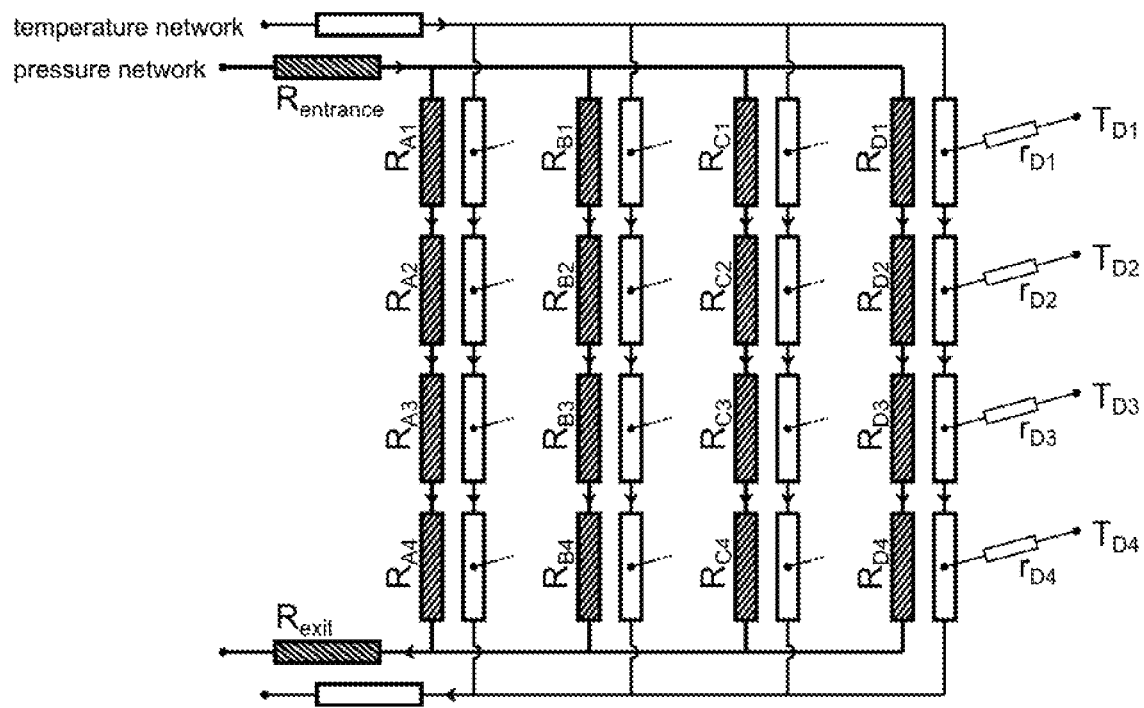
FIG. 3 shows a thermal network describing the cooling system according to the embodiment of present invention.

FIG. 3 shows a thermal network describing the cooling system according to the embodiment of present invention.

Each resistance represents the portion of a duct that is covered by a fan and therefore corresponds to a set of parallel duct sections. The resistances R (with subscript {A,B,C,D} indicating connected ducts and subscript {1,2, 3,4} indicating vertical position) in the pressure network describe the pressure drop minus the pressure head, where the pressure head correlates with the oil temperature and provides the driving force for natural convective circulation, and the pressure drop depends on the local oil flow velocity. The resistances r (with the same subscripts) describe the thermal resistance to the air which will be for natural convection if the fan is off and for forced convection if the fan is on. As shown in FIG. 3, the thermal resistance $RD_1$, $RD_2$, $RD_3$, $RD_4$ may be respectively adjusted by the fans F-4-1, F-4-2, F-4-3, F-4-4 in the fan group F-4. For avoidance of redundancy, the thermal resistance correlated to the fans of the other fan groups F-1, F-2, F-3 is omitted.

As can be seen in FIG. 3, if the thermal resistance $r_{D1}$ is reduced by turning on the fan F-4-1, the temperature will not only be reduced locally but also in the downstream duct which will increase the pressure head everywhere along this duct. On the other hand, if instead the thermal resistance $r_{D4}$ is reduced there is no downstream region and the fan cooling capacity is therefore less. The calculation will be further improved if it includes the transformer tank and the heat generating components such as the core and the windings, since they will also affect the pressure balance and tank temperature gradient (i.e. the boundary conditions for the thermal network). The cooling capacity calculation may either be performed once and used as input for the control system, or it may be performed in real-time. In the latter case, the fans may be fitted with air temperature sensors (measuring temperatures $T_{D1}$ to $T_{D4}$ in FIG. 3 as well as the other air temperatures) to provide more accurate data to the calculation algorithm. Other heat transfer calculation methods such as CFD may also be used to obtain the cooling capacity but will be much more time consuming and not suitable for real-time use.

Measuring requires the possibility to test each fan's cooling capacity individually with the transformer running on a steady base load, placed on the actual site it is going to operate (the achieved steady state temperature gives the cooling capacity of the setup used). The values of each fans cooling capacity can be fed into the database to calculate the complete cooling capacity. For more detailed cooling capacity estimations, the same procedure should be done with combinations of several fans. As the cooling capacity of fan A and fan B might be lower than the added cooling capacity of fan A+B. In case of transformer running long time on steady load, and stable environmental conditions (such as ambient temperature), a self-learning algorithm can be implemented, where different fan combinations are activated by the system, and the steady state temperature achieved on the transformer is measured. The system can then automatically update the cooling rate for such combinations in the database.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A cooling system for an electromagnetic induction device, including:
   at least one duct filled with a first coolant and surrounded by a second coolant, each of the at least one duct being routed along a direction of natural convection;
   at least one group of fans, each fan of the at least one group of fans being mounted along a respective duct of the at least one duct along the direction of natural convection and being configured to blow for the-second-coolant-forced cooling;
   at least one group of electric motors, each electric motor being configured to operate a respective fan of the at least one group of fans;
   at least one group of switches, each switch being configured to control a respective electric motor of the at least one group of electric motors; and
   a control system, being configured to:
   obtain at least one group of data sets, each data set representing a parameter associated with a respective fan of the at least one group of fans, wherein the parameter concerns a level of the respective fan along the direction of natural convection;
   obtain criteria for cooling rate optimization of the cooling system based on operating temperatures of the electromagnetic induction device with different fan combinations activated with a cooling rate of each of the different fan combinations stored in a database;
   in consideration of the parameter obtained, through knowledge-based predetermined numerical and/or logical linkages and cooling rates stored for the different fan combinations, select a minimum number of fans in the at least one group of fans to blow for the-second-coolant-forced cooling to supply a predetermined amount of cooling capacity according to criteria obtained for cooling rate optimization of the cooling system to thereby minimize power consumption of the at least one group of fans; and
   individually control each switch to thereby obtain individual control of each fan.

2. The cooling system according to claim 1, wherein:
   the control system is further configured to control to start the at least one fan selected and to suspend the rest of the at least one group of fans.

3. The cooling system according to claim 1, wherein:
   the at least one duct comprises a plurality of ducts and the parameter associated with the respective fan further concerns with which of the plurality of ducts the respective fan is mounted along.

4. The cooling system according to claim 1, wherein:
   at least two fans of the at least one group of fans are mounted at different levels along the direction of natural convection.

5. The cooling system according to claim 1, wherein the at least one duct comprises a plurality of ducts and at least two fans of the at least one group of fans are mounted along different ducts of the plurality of ducts.

6. The cooling system according to claim 1, wherein:
   the first coolant uses dielectric liquid; and
   the second coolant uses air.

7. The cooling system according to claim 2, wherein:
   the parameter associated with the respective fan further concerns with which of the at least one duct the respective fan is mounted along.

8. The cooling system according to claim 2, wherein:
   at least two fans of the at least one group of fans are mounted at different levels along the direction of natural convection.

9. The cooling system according to claim 2, wherein the at least one duct comprises a plurality of ducts and at least two fans of the at least one group of fans are mounted along different ducts of the plurality of ducts.

10. A method of cooling an electromagnetic induction device, wherein:
    the electromagnetic induction device includes:
    at least one duct filled with a first coolant and surrounded by a second coolant, each being routed along a direction of natural convection;
    at least one group of fans, each fan of the at least one group of fans being mounted along a respective duct of the at least one duct along the direction of natural convection and being configured to blow for the-second-coolant-forced cooling;
    at least one group of electric motors, each electric motor being configured to operate a respective fan of the at least one group of fans;
    at least one group of switches, each switch being configured to control a respective electric motor of the at least one group of electric motors; and the method including:
    obtaining at least one group of data sets, each data set representing a parameter associated with a respective fan of the at least one group of fans, wherein the parameter concerns a level of the respective fan along the direction of natural convection;
    obtaining criteria for cooling rate optimization of the cooling system based on operating temperatures of the electromagnetic induction device with different fan combinations activated with a cooling rate of each of the different fan combinations stored in a database;
    in consideration of the parameter obtained, through knowledge-based predetermined numerical and/or logical linkages and cooling rates stored for the different fan combinations, selecting a minimum number of fans in the at least one group of fans to blow for the-second-coolant-forced cooling to supply a predetermined amount of cooling capacity according to criteria obtained for cooling rate optimization of the cooling system to thereby minimize power consumption of the at least one group of fans; and individually controlling each switch to thereby obtain individual control of each fan.

11. The method according to claim 10, further including:
controlling to start the at least one fan selected and to suspend the rest of the at least one group of fans.

12. The method according to claim 10, wherein:
the at least one duct comprises a plurality of ducts and the parameter associated with the respective fan further concerns with which of the plurality of ducts the respective fan is mounted along.

13. The method according to claim 10, wherein:
at least two fans of the at least one group of fans are mounted at different levels along the direction of natural convection.

14. The method according to claim 10, wherein the at least one duct comprises a plurality of ducts and at least two fans of the at least one group of fans are mounted along different ducts of the plurality of ducts.

15. The method according to claim 10, wherein:
the first coolant uses dielectric liquid; and
the second coolant uses air.

16. The method according to claim 11, wherein the at least one duct comprises a plurality of ducts and the parameter associated with the respective fan further concerns with which of the plurality of ducts the respective fan is mounted along.

* * * * *